United States Patent
Liu et al.

(10) Patent No.: US 9,960,795 B1
(45) Date of Patent: May 1, 2018

(54) SEMICONDUCTOR DEVICE AND OPERATING METHOD THEREOF

(71) Applicant: Samsung Electronics Co., Ltd., Suwon-si, Gyeonggi-do (KR)

(72) Inventors: Qing Liu, Suwon-si (KR); Dae Hyun Kwon, Seoul (KR); Hui Changhsiang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/584,116

(22) Filed: May 2, 2017

(30) Foreign Application Priority Data

Oct. 31, 2016 (KR) .................. 10-2016-0143059

(51) Int. Cl.
| | |
|---|---|
| *H04B 1/06* | (2006.01) |
| *H04B 7/00* | (2006.01) |
| *H04B 1/04* | (2006.01) |
| *H03F 3/19* | (2006.01) |
| *H03F 3/24* | (2006.01) |
| *H04W 84/04* | (2009.01) |

(52) U.S. Cl.
CPC ............ *H04B 1/0475* (2013.01); *H03F 3/19* (2013.01); *H03F 3/245* (2013.01); *H03F 2200/165* (2013.01); *H03F 2200/333* (2013.01); *H03F 2200/411* (2013.01); *H03F 2200/451* (2013.01); *H04B 2001/0408* (2013.01); *H04W 84/042* (2013.01)

(58) Field of Classification Search
CPC . H04B 1/0475; H04B 2001/0408; H03F 3/19; H03F 3/245; H03F 2200/165; H03F 2200/333; H03F 2200/411; H03F 2200/451; H04W 84/042
See application file for complete search history.

(56) References Cited

U.S. PATENT DOCUMENTS

| | | |
|---|---|---|
| 7,519,348 B2 | 4/2009 | Shah |
| 7,683,733 B2 | 3/2010 | Li et al. |
| 8,428,545 B1 | 4/2013 | Kaunisto et al. |
| 8,493,126 B2 | 7/2013 | Sankaranarayanan et al. |
| 8,704,582 B2 | 4/2014 | Goel et al. |
| 9,166,731 B2 | 10/2015 | Chang et al. |
| 9,350,396 B2 | 5/2016 | Jiang et al. |

(Continued)

OTHER PUBLICATIONS

O. Oliaei, et al. "A Multiband Multimode Transmitter Without Driver Amplifier", *ISSCC Dig. Tech. Papers*, pp. 164-166, Feb. 2012.

(Continued)

*Primary Examiner* — Nguyen Vo
(74) *Attorney, Agent, or Firm* — Harness, Dickey & Pierce, P.L.C.

(57) ABSTRACT

Provided are a semiconductor device and an operating method thereof. A semiconductor device includes a mixer configured to upconvert a baseband signal using a local oscillator (LO) signal; and a notch filter configured to receive the upconverted signal from the mixer and filter notch frequency components, the notch filter further configured to resonate at a fundamental frequency to provide a higher impedance and resonate at a notch frequency different from the fundamental frequency to provide a lower impedance.

19 Claims, 5 Drawing Sheets

(56) References Cited

U.S. PATENT DOCUMENTS

| | | | |
|---|---|---|---|
| 2010/0136942 A1* | 6/2010 | Lee | H04B 1/18 |
| | | | 455/334 |
| 2014/0140455 A1 | 5/2014 | Mirzaei et al. | |
| 2014/0184356 A1* | 7/2014 | Kihara | H01L 27/016 |
| | | | 333/174 |
| 2014/0266506 A1 | 9/2014 | Andersson et al. | |
| 2014/0266531 A1 | 9/2014 | Leipold et al. | |
| 2015/0044979 A1 | 2/2015 | Seckin et al. | |
| 2015/0094004 A1* | 4/2015 | Vora | H03D 7/166 |
| | | | 455/114.1 |

OTHER PUBLICATIONS

P. Rossi, et al."An LTE Transmitter Using a Class-A/B Power Mixer", *ISSCC Dig. Tech. Papers*, pp. 340-342, Feb. 2013.

M. Ingels, et al. "A Multiband 40nm CMOS LTE SAW-Less Modulator with -60dBc C-IM3," *ISSCC Digest Tech. Papers*, pp. 338-339, Feb. 2013.

C. Yen-Horng , et al."An LTE SAW-Less Transmitter Using 33% Duty-Cycle LO Signals for Harmonic Suppression," *ISSCC Digest Tech. Papers*, pp. 172-174, Feb. 2015.

T.Kihara , et al."A Multiband LTE SAW-less CMOS Transmitter with Source-Follower-Drived Passive Mixers, Envelope-Tracked RF-PGAs, and Marchand Baluns ," *IEEE Radio Frequency Integrated Circuits Symp.*, pp. 399-402, Jun. 2012.

\* cited by examiner

SEMICONDUCTOR DEVICE AND OPERATING METHOD THEREOF

CROSS-REFERENCE TO RELATED APPLICATION

This application claims priority from Korean Patent Application No. 10-2016-0143059 filed on Oct. 31, 2016 in the Korean Intellectual Property Office, and all the benefits accruing therefrom under 35 U.S.C. 119, the contents of which in its entirety are herein incorporated by reference.

BACKGROUND

1. Technical Field

The inventive concepts relate to a semiconductor device and an operating method thereof.

2. Description of the Related Art

A conventional power mixer used in a wireless communication system such as an LTE system has a lower efficiency than a driver amplifier (DA). In a transmitter structure using the power mixer, extra cost and power are required to remove harmonic frequency components. For example, when a plurality of DAs are used to remove harmonic frequency components, power consumption becomes very large. Accordingly, a transmitter that operates at low power while satisfying the required linearity and noise performance is desired to overcome this problem.

SUMMARY

Example embodiments of the inventive concepts provide a semiconductor device for effectively filtering harmonic frequency components while operating at low power.

Example embodiments of the inventive concepts also provide an operating method of a semiconductor device for effectively filtering harmonic frequency components while operating at low power.

However, example embodiments of the inventive concepts are not restricted to the one set forth herein. The above and other example embodiments of the inventive concepts will become more apparent to one of ordinary skill in the art to which the inventive concepts pertains by referencing the detailed description of the inventive concepts given below.

According to an example embodiment of the inventive concepts, there is provided a semiconductor device including a mixer configured to upconvert a baseband signal using a local oscillator (LO) signal; and a notch filter configured to receive the upconverted signal from the mixer and filter notch frequency components, the notch filter further configured to resonate at a fundamental frequency to provide a higher impedance and resonate at a notch frequency different from the fundamental frequency to provide a lower impedance.

According to another example embodiment of the inventive concepts, there is provided a semiconductor device including a mixer configured to upconvert a baseband signal using a local oscillator (LO) signal; at least one resistor at an input terminal of the mixer and through which the baseband signal passes; and a notch filter configured to receive the upconverted signal from the mixer and filter notch frequency components, the notch filter further configured to resonate at a fundamental frequency to provide a higher impedance and resonate at a notch frequency different from the fundamental frequency to provide a lower impedance. The at least one resistor has a value lower than the higher impedance and higher than the lower impedance.

According to another example embodiment of the inventive concepts, there is provided a notch filter including a first capacitor, a first inductor, a second capacitor and a second inductor. The second capacitor, connected in series with the first inductor and the first capacitor between a first node and a second node. The first and second capacitors are configured to resonate together at a notch frequency to reduce a third harmonic of upconverted first and second baseband signals received at the first and second nodes, respectively. The second inductor connected between the first node and the second node in parallel with the first inductor. The first and second inductors are configured to resonate together at a fundamental frequency to provide a higher impedance at the fundamental frequency.

These and other inventive concepts of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The above and other example embodiments and features of the inventive concepts will become more apparent by describing in detail example embodiments thereof with reference to the attached drawings, in which.

DETAILED DESCRIPTION OF THE EMBODIMENTS

Figure 1:
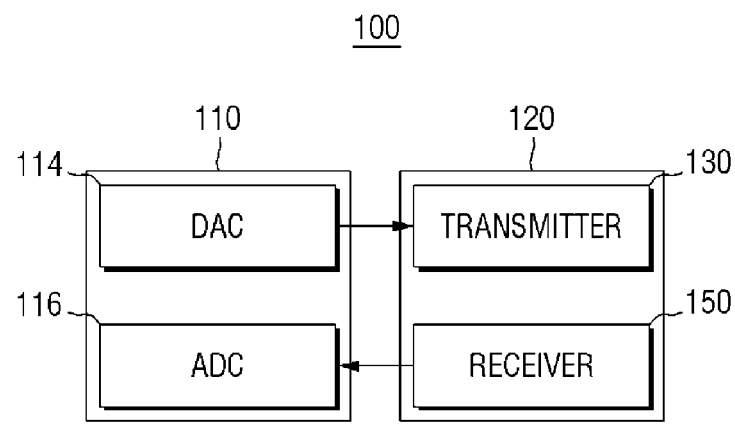
FIG. 1 is a block diagram illustrating a semiconductor device according to an example embodiment of the inventive concepts.

FIG. 1 is a block diagram illustrating a semiconductor device according to an example embodiment of the inventive concepts.

Referring to FIG. 1, a semiconductor device 100 according to an example embodiment of the inventive concepts may include a digital IC 110 and a transceiver 120.

The digital IC 110 may include a memory for storing data, program codes and the like, and a processor for processing the data, program codes and the like. Further, in some example embodiments of the inventive concepts, the digital IC 110 may further include an additional interface for transmitting commands for controlling internal components or signals to be provided to the internal components.

The transceiver 120 may include a transmitter 130 and a receiver 150 to support bidirectional communication. In some example embodiments of the inventive concepts, the number of transmitters and receivers included in the semiconductor device 100 may be an arbitrary number to support an environment such as a communication system, a frequency band and the like.

The transmitter 130 receives I and Q analog signals converted from digital signals from the digital IC 110 through a digital-to-analog converter 114. Then, the transmitter 130 passes the I and Q analog signals through a low pass filter or amplifies them to obtain I and Q baseband signals. The transmitter 130 upconverts the I and Q baseband signals using a TX local oscillator (LO) signal, and then amplifies the upconverted signals to a power level required for transmission as RF signals. The amplified signals are transmitted wirelessly via an antenna.

The receiver 150 receives the RF signals through the antenna and downconverts the received RF signals using an RX LO signal to restore the I and Q baseband signals. Then, the receiver 150 amplifies the I and Q baseband signals or passes them through a low pass filter, and provides I and Q analog signals to an analog-to-digital converter 116 of the digital IC 114. The I and Q analog signals may be converted into digital signals by the analog-to-digital converter 116 and processed, for example, by a processor of the digital IC 110.

In some example embodiments of the inventive concepts, the transceiver 120 may be implemented as one or more analog ICs, RF ICs, mixed-signal ICs, etc., but the inventive concepts is not limited thereto. Meanwhile, the transceiver 120 may be implemented in accordance with a superheterodyne architecture or a direct conversion architecture, but the inventive concepts is not limited thereto.

Figure 2:
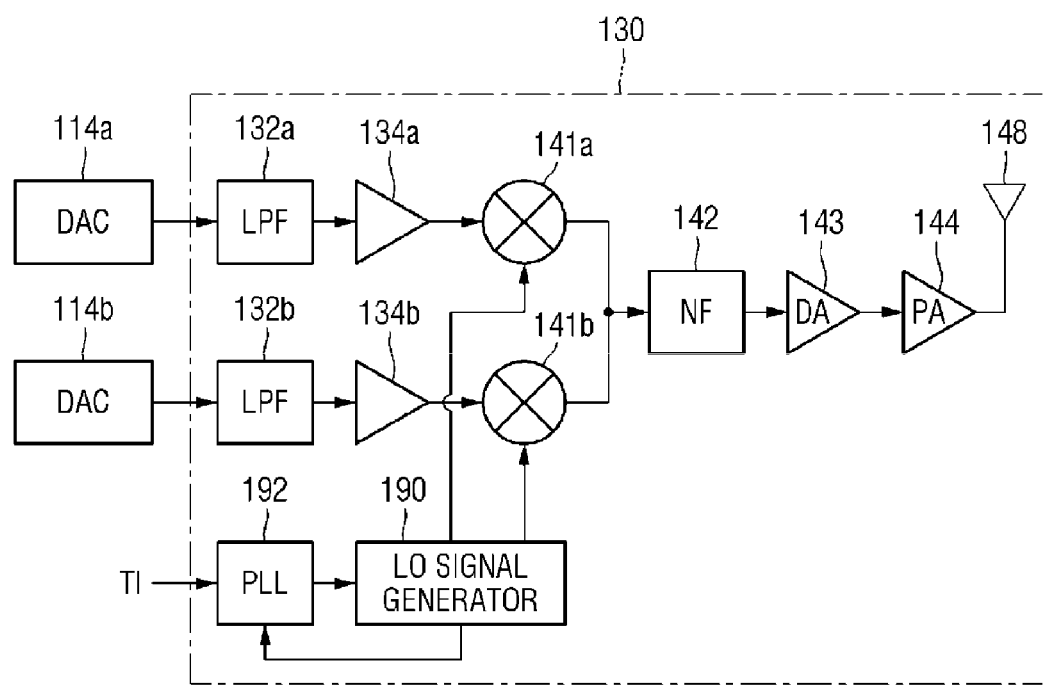
FIG. 2 is a block diagram illustrating a transmitter of the semiconductor device according to an example embodiment of the inventive concepts.

FIG. 2 is a block diagram illustrating the transmitter of the semiconductor device according to an example embodiment of the inventive concepts.

Referring to FIG. 2, the transmitter 130 of the semiconductor device according to an example embodiment of the inventive concepts includes low-pass filters 132a and 132b, amplifiers 134a and 134b, mixers 141a and 141b, a notch filter 142, a driving amplifier (DA) 143, a power amplifier (PA) 144, and an antenna 148. The transmitter 130 may further include a phase locked loop (PLL) 192 and an LO signal generator 190 for generating LO signals to be provided to the mixers 141a and 141b.

The transmitter 130 receives an I analog signal from a digital-to-analog converter 114a and receives a Q analog signal from a digital-to-analog converter 114b. The I analog signal and the Q analog signal pass through the low-pass filters 132a and 132b, respectively, to remove unnecessary regions generated in the digital-to-analog conversion.

The I analog signal and the Q analog signal that have passed through the low-pass filters 132a and 132b pass through the amplifiers 134a and 134b, respectively, and then are outputted as an I baseband signal and a Q baseband signal.

The mixer 141a upconverts the I baseband signal using a first TX LO signal generated from the LO signal generator 190. The TX LO signal includes a periodic signal having a specific fundamental frequency. The PLL 192 receives timing information (TI) from, for example, the digital IC 110 and sends a control signal for adjusting the frequency or phase of the TX LO signal to the LO signal generator 190. Similarly, the mixer 141b upconverts the Q baseband signal using a second TX LO signal generated from the LO signal generator 190.

The notch filter 142 receives the signals upconverted by the mixers 141a and 141b and filters notch frequency components. The notch filter 142 will be described later with reference to FIGS. 3 to 5.

The upconverted signals that have passed through the notch filter 142 are amplified to a power level required for transmission as RF signals through the DA 143 and the PA 144 and then transmitted wirelessly through the antenna 148.

Figure 3:
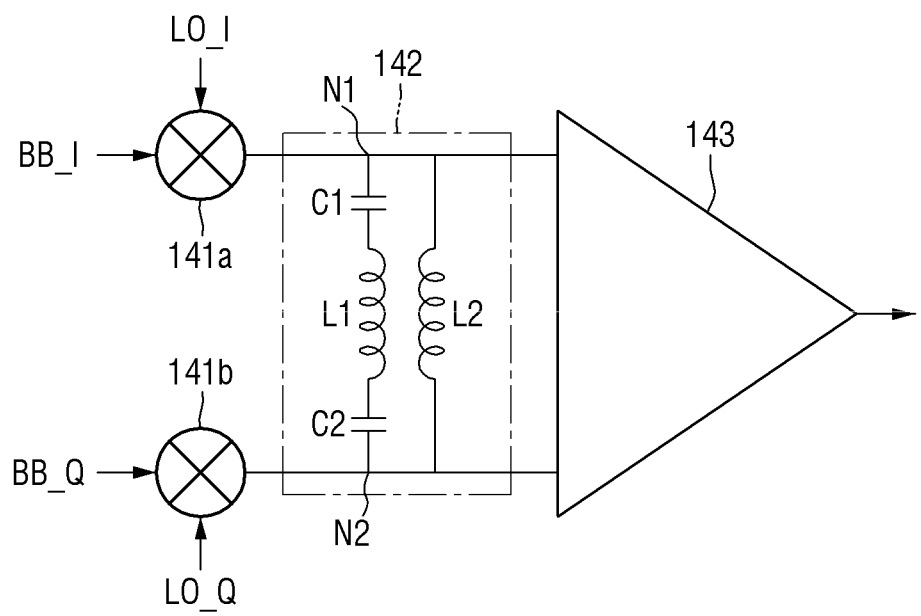
FIG. 3 is a circuit diagram illustrating a notch filter of the semiconductor device according to an example embodiment of the inventive concepts.

FIG. 3 is a circuit diagram illustrating the notch filter of the semiconductor device according to an example embodiment of the inventive concepts.

Referring to FIG. 3, the notch filter 142 of the semiconductor device 100 according to an example embodiment of the inventive concepts may be disposed between the mixers 141a and 141b and the DA 143. However, the inventive concepts are not limited thereto, and the arrangement of the notch filter 142 may vary depending on the specific purpose of implementing the semiconductor device 100.

The notch filter 142 resonates at a fundamental frequency to provide a higher impedance and resonates at a notch frequency different from the fundamental frequency to provide a lower impedance. In some example embodiments of the inventive concepts, the notch frequency may include a third harmonic frequency.

Specifically, the notch filter 142 may include a first inductor L1, a second inductor L2 connected in parallel with the first inductor L1, a first capacitor C1 connected in series with the first inductor L1 at one end of the first inductor L1 and a second capacitor C2 connected in series with the first inductor L1 at the other end of the first inductor L1. A first node N1 may connect to the mixer 141a and the DA 143. A second node N2 may connect the mixer 141b and the DA 143. The second inductor L2 may be connected between the first node N1 and the second node N2. The a first capacitor C1 connected in series with the first inductor L1 and the second capacitor C2 may be connected between the first node N1 and the second node N2.

The first inductor L1 and the second inductor L2 connected in parallel with each other resonate at the fundamental frequency to provide a higher impedance as a mixer load. On the other hand, the first inductor L1, the first capacitor C1 and the second capacitor C2 connected in series with each other resonate at the notch frequency to provide a lower impedance for removing the third harmonic frequency.

Accordingly, the notch filter 142 can simultaneously tune the fundamental frequency and the notch frequency, i.e., the third harmonic frequency, by the first capacitor C1 and the second capacitor C2.

Figure 4:
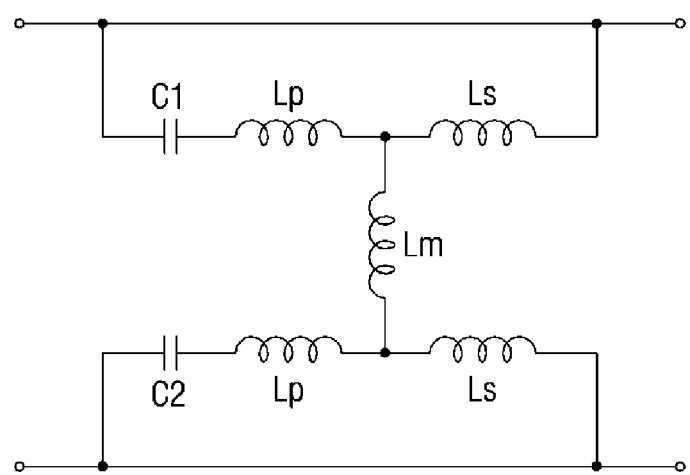
FIG. 4 is a circuit diagram showing an equivalent circuit corresponding to the notch filter of the semiconductor device according to an example embodiment of the inventive concepts.
Figure 5:
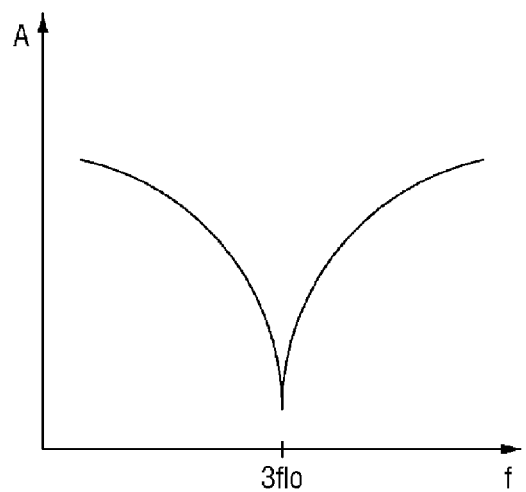
FIG. 5 is a diagram explaining an operation of the notch filter of the semiconductor device according to an example embodiment of the inventive concepts.

FIG. 4 is a circuit diagram showing an equivalent circuit corresponding to the notch filter of the semiconductor device according to an example embodiment of the inventive concepts. FIG. 5 is a diagram explaining an operation of the notch filter of the semiconductor device according to an example embodiment of the inventive concepts.

Referring to FIGS. 4 and 5, an equivalent circuit corresponding to the notch filter 142 of the semiconductor device 100 according to an example embodiment of the inventive concepts may be represented as shown in FIG. 4.

In FIG. 4, Lp represents a first stage inductance, Ls represents a second stage inductance, and Lm represents a mutual inductance between the first stage inductance and the second stage inductance.

In this case, when only the upper half of the equivalent circuit shown in FIG. 4 is taken into consideration, that is, when Lm is replaced with 0.5 Lm (Lc), a load impedance is expressed by the following equation (1).

$$\frac{jw(L_s + L_c) - jw^3 C(L_sL_c + L_sL_p + L_p + L_c)}{1 - w^2C(L_s + L_p)} \quad (1)$$

From the equation (1), a pole frequency and a zero frequency are expressed by the following equations (2) and (3), respectively.

$$fpole = \frac{1}{\sqrt{(L_s + L_p)C}} \quad (2)$$

$$fzero = \frac{\sqrt{L_c + L_s}}{\sqrt{(L_sL_c + L_sL_p + L_pL_c)C}} \quad (3)$$

From the equations (2) and (3), the following equation (4) can be derived.

$$\frac{f_{zero}}{f_{pole}} = \frac{\sqrt{(L_s + L_p)(L_c + L_s)}}{\sqrt{(L_sL_c + L_sL_p + L_pL_c)C}} \quad (4)$$

In the equation (4), a ratio of the zero frequency 3flo (third harmonic frequency) to the pole frequency flo (fundamental frequency) is independent of tuning the capacitor and is determined solely by the transformer itself. Therefore, if the transformer is designed to satisfy $$\frac{\sqrt{(L_s + L_p)(L_c + L_s)}}{\sqrt{(L_sL_c + L_sL_p + L_pL_c)}} = 3,$$

the pole frequency flo and the zero frequency 3flo can be tuned simultaneously.

FIG. 5 shows a frequency response of the notch filter 142 described above.

Figure 6:
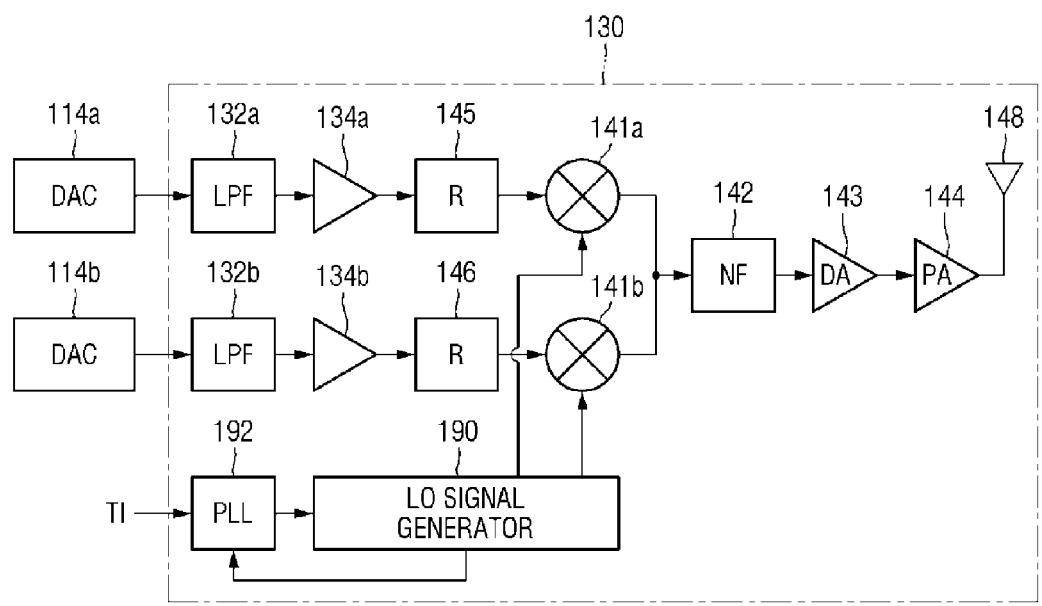
FIG. 6 is a block diagram illustrating a transmitter of a semiconductor device according to another example embodiment of the inventive concepts.

FIG. 6 is a block diagram illustrating a transmitter of a semiconductor device according to another example embodiment of the inventive concepts.

Referring to FIG. 6, the transmitter 130 of the semiconductor device according to another example embodiment of the inventive concepts includes the low-pass filters 132a and 132b, the amplifiers 134a and 134b, resistors 145 and 146, the mixers 141a and 141b, the notch filter 142, the drive amplifier (DA) 143, the power amplifier (PA) 144 and the antenna 148. The transmitter 130 may further include the phase locked loop (PLL) 192 and the LO signal generator 190 for generating LO signals to be provided to the mixers 141a and 141b.

This example embodiment is different from the example embodiment of FIG. 2 in that resistors 145 and 146 are additionally disposed at the front ends of the mixers 141a and 141b.

That is, the I analog signal and the Q analog signal that have passed through the low-pass filters 132a and 132b pass through the amplifiers 134a and 134b, respectively, and then are outputted as an I baseband signal and a Q baseband signal. The I baseband signal and the Q baseband signal are transmitted to the mixers 141a and 141b through the resistors 145 and 146, respectively.

The mixer 141a upconverts the I baseband signal that has passed through the resistor 145 using a first TX LO signal generated from the LO signal generator 190, and the mixer 141b upconverts the Q baseband signal that has passed through the resistor 146 using a second TX LO signal generated from the LO signal generator 190.

Thereafter, the notch filter 142 receives the signals upconverted by the mixers 141a and 141b and filters notch frequency components.

The resistors 145 and 146 have values lower than the higher impedance at which the notch filter 142 resonates at the fundamental frequency. In particular, the values of the resistors 145 and 146 are negligible in the operation in which the notch filter 142 resonates at the fundamental frequency.

On the other hand, the resistors 145 and 146 have values higher than the lower impedance at which the notch filter 142 resonates at the notch frequency. Accordingly, the resistors 145 and 146 serve as current sources for the mixers 141a and 141b, which makes it possible to more effectively reduce or remove the notch frequency (i.e., the third harmonic frequency) components.

Figure 7:
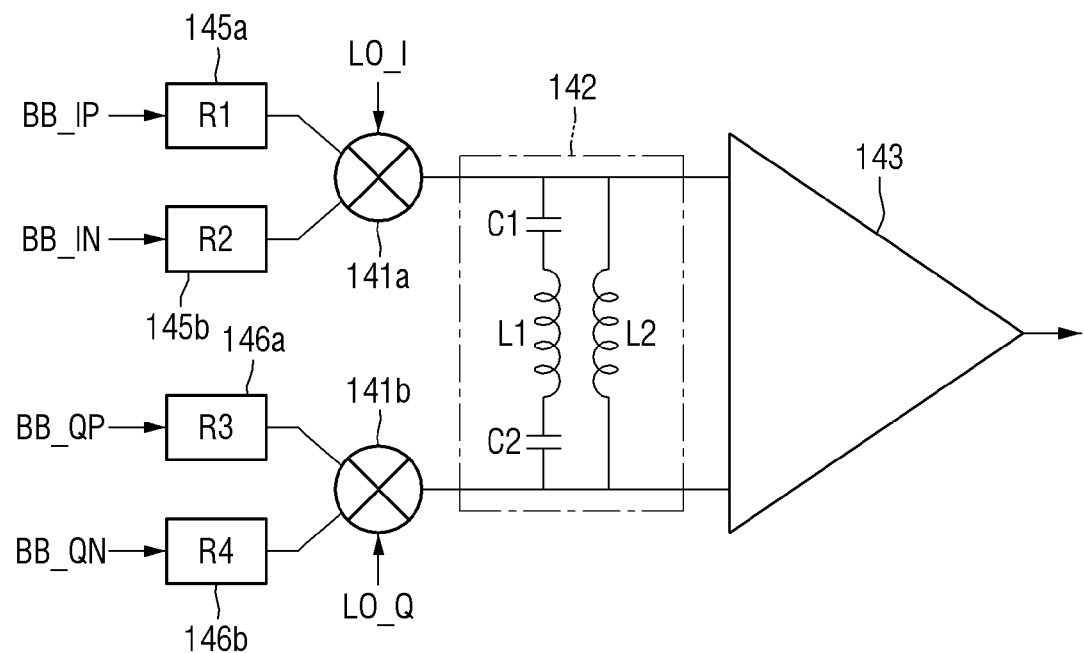
FIG. 7 is a circuit diagram illustrating a notch filter of the semiconductor device according to another example embodiment of the inventive concepts.

FIG. 7 is a circuit diagram illustrating the notch filter of the semiconductor device according to another example embodiment of the inventive concepts.

Referring to FIG. 7, the notch filter 142 of the semiconductor device 100 according to another example embodiment of the inventive concepts may be disposed between the mixers 141a and 141b and the DA 143. Further, resistors 145a and 145b are disposed at an input terminal of the mixer 141a and resistors 146a and 146b may be disposed at an input terminal of the mixer 141b. However, the inventive concepts are not limited thereto, and the arrangement of the notch filter 142 may vary depending on the specific purpose of implementing the semiconductor device 100.

The notch filter 142 resonates at a fundamental frequency to provide a higher impedance and resonates at a notch frequency different from the fundamental frequency to provide a lower impedance. In some example embodiments of the inventive concepts, the notch frequency may include a third harmonic frequency.

The first inductor L1 and the second inductor L2 connected in parallel with each other resonate at the fundamental frequency to provide a higher impedance as a mixer load. On the other hand, the first inductor L1, the first capacitor C1 and the second capacitor C2 connected in series with each other resonate at the notch frequency to provide a lower impedance for removing the third harmonic frequency.

As described above, the resistors 145 and 146 have values lower than the higher impedance at which the notch filter 142 resonates at the fundamental frequency. On the other hand, the resistors 145 and 146 have values higher than the lower impedance at which the notch filter 142 resonates at the notch frequency.

Therefore, the notch filter 142 can simultaneously tune the fundamental frequency and the notch frequency, i.e., the third harmonic frequency, by means of the first capacitor C1 and the second capacitor C2, and can also more effectively reduce or remove the third harmonic frequency components.

Figure 8:
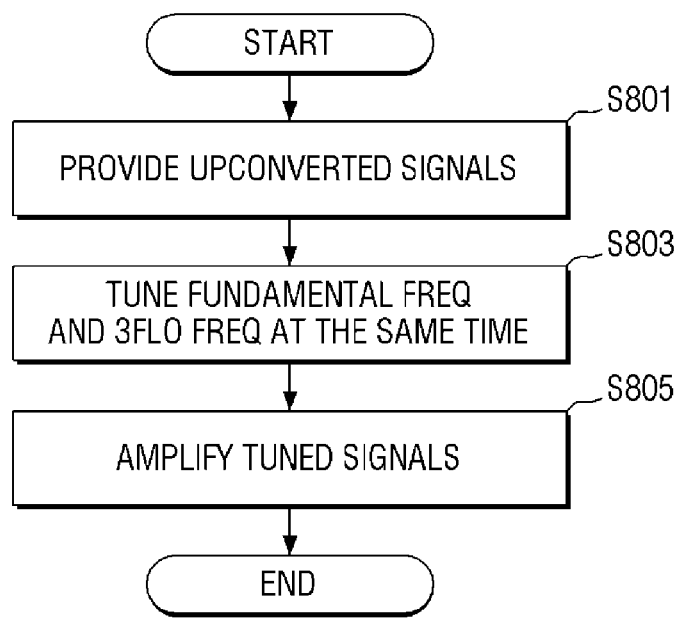
FIG. 8 is a flowchart illustrating an operating method of the semiconductor device according to an example embodiment of the inventive concepts.

FIG. 8 is a flowchart illustrating an operating method of the semiconductor device according to an example embodiment of the inventive concepts.

Referring to FIG. 8, an operating method of the semiconductor device according to an example embodiment of the inventive concepts includes providing upconverted baseband signals using LO signals (S801), and tuning the fundamental frequency components and the notch frequency components in the upconverted signals at the same time by using the notch filter 142 (S803).

The notch filter 142 operates as described above, and a redundant description is omitted.

The operating method of the semiconductor device according to an example embodiment of the inventive concepts may further include amplifying the signals outputted from the notch filter 142 and providing transmit RF signals (S805).

According to various example embodiments of the inventive concepts as described above, the notch filter 142 can simultaneously tune the fundamental frequency and the notch frequency, i.e., the third harmonic frequency, and can also more effectively remove the third harmonic frequency components.

Although the preferred embodiments of the inventive concepts have been disclosed for illustrative purposes, those skilled in the art will appreciate that various modifications, additions and substitutions are possible, without departing from the scope and spirit of the inventive concepts as disclosed in the accompanying claims.

What is claimed is:

1. A semiconductor device comprising:
   a mixer configured to upconvert a baseband signal using a local oscillator (LO) signal; and
   a notch filter configured to receive the upconverted signal from the mixer and filter notch frequency components, the notch filter further configured to resonate at a fundamental frequency to provide a higher impedance and resonate at a notch frequency different from the fundamental frequency to provide a lower impedance,
   wherein the notch filter includes a first inductor, a second inductor connected in parallel with the first inductor, a first capacitor connected in series with the first inductor at a first end of the first inductor, and a second capacitor connected in series with the first inductor at a second end of the first inductor, and
   the fundamental frequency and the notch frequency are simultaneously tuned by the first capacitor and the second capacitor.

2. The semiconductor device of claim 1, wherein the first inductor and the second inductor are configured to resonate at the fundamental frequency to provide the higher impedance.

3. The semiconductor device of claim 1, wherein the first inductor, the first capacitor and the second capacitor are configured to resonate at the notch frequency to provide the lower impedance.

4. The semiconductor device of claim 1, further comprising at least one resistor at an input terminal of the mixer, the at least one resistor is configured to pass the baseband signal.

5. The semiconductor device of claim 1, wherein the notch frequency includes a third harmonic frequency.

6. The semiconductor device of claim 1, further comprising a power amplifier (PA) configured to amplify a signal outputted from the notch filter and provide a transmit RF signal.

7. The semiconductor device of claim 6, further comprising a driver amplifier (DA) between the notch filter and the PA, the DA configured to drive the PA.

8. A semiconductor device comprising:
   a mixer configured to upconvert a baseband signal using a local oscillator (LO) signal;
   at least one resistor at an input terminal of the mixer and through which the baseband signal passes; and
   a notch filter configured to receive the upconverted signal from the mixer and filter notch frequency components, the notch filter further configured to resonate at a fundamental frequency to provide a higher impedance and resonate at a notch frequency different from the fundamental frequency to provide a lower impedance, the at least one resistor has a value lower than the higher impedance and higher than the lower impedance.

9. The semiconductor device of claim 8, wherein the notch filter includes a first inductor, a second inductor connected in parallel with the first inductor, a first capacitor connected in series with the first inductor at a first end of the first inductor, and a second capacitor connected in series with the first inductor at a second end of the first inductor.

10. The semiconductor device of claim 9, wherein the first inductor and the second inductor are configured to resonate at the fundamental frequency to provide the higher impedance.

11. The semiconductor device of claim 9, wherein the first inductor, the first capacitor and the second capacitor are configured to resonate at the notch frequency to provide the lower impedance.

12. The semiconductor device of claim 8, wherein the notch frequency includes a third harmonic frequency.

13. The semiconductor device of claim 8, further comprising a power amplifier (PA) configured to amplify a signal outputted from the notch filter and provide a transmit RF signal.

14. The semiconductor device of claim 13, further comprising a driver amplifier (DA) between the notch filter and the PA, the DA configured to drive the PA.

15. A notch filter comprising:
   a first capacitor;
   a first inductor;
   a second capacitor, connected in series with the first inductor and the first capacitor between a first node and a second node, the first and second capacitors being configured to resonate together at a notch frequency to reduce a third harmonic of upconverted first and second baseband signals received at the first and second nodes, respectively; and
   a second inductor connected between the first node and the second node in parallel with the first inductor, the first and second inductors being configured to resonate together at a fundamental frequency to provide a higher impedance at the fundamental frequency, wherein
   the fundamental frequency and the notch frequency are simultaneously tuned by the first capacitor and the second capacitor.

16. A semiconductor device comprising:
   the notch filter of claim 15; and
   a first and a second mixer configured to upconvert the first and the second baseband signal respectively based on a first and a second local oscillator signal respectively, the first and second inductors configured to resonate together at the fundamental frequency to provide the higher impedance as a mixer load.

17. The semiconductor device of claim 16 further comprising:
- a first and second lower pass filter configured to receive a first and a second analog signal respectively and output the first and the second baseband signal respectively; and
- a first and a second amplifier configured to amplify the first and the second baseband signal respectively.

18. The semiconductor device of claim 17 further comprising:
- a first and a second resistor connected between the first and the second amplifier and the first and the second mixer, respectively.

19. A semiconductor device comprising:
- the notch filter of claim 15;
- a power amplifier configured to amplify a signal output from the notch filter and provide a transmit RF signal; and
- a driver amplifier configured to drive the power amplifier.

* * * * *